United States Patent [19]

Burghartz et al.

[11] Patent Number: 5,793,272

[45] Date of Patent: Aug. 11, 1998

[54] INTEGRATED CIRCUIT TOROIDAL INDUCTOR

[75] Inventors: Joachim Norbert Burghartz, Shrub Oak; Daniel Charles Edelstein, New Rochelle; Christopher Vincent Jahnes, Monsey; Cyprian Emeka Uzoh, Hopewell Junction, all of N.Y.

[73] Assignee: International Business Machines Corporation, Armonk, N.Y.

[21] Appl. No.: 701,922

[22] Filed: Aug. 23, 1996

[51] Int. Cl.⁶ .............................. H01F 5/00; H01F 27/24; H01F 27/28

[52] U.S. Cl. .................. 336/200; 336/219; 336/223; 336/229

[58] Field of Search ..................... 336/200, 219, 336/223, 222, 177, 229

[56] References Cited

U.S. PATENT DOCUMENTS

| | | | |
|---|---|---|---|
| 4,060,784 | 11/1977 | Fergestad | 336/177 |
| 4,418,470 | 12/1983 | Naster et al. | 29/577 |
| 4,494,100 | 1/1985 | Stengel et al. | 336/200 |
| 4,648,087 | 3/1987 | Scranton et al. | 360/103 |
| 5,070,317 | 12/1991 | Bhagat | 336/200 |
| 5,095,357 | 3/1992 | Andoh et al. | 357/51 |
| 5,227,659 | 7/1993 | Hubbard | 257/531 |
| 5,279,988 | 1/1994 | Saadat et al. | 437/195 |
| 5,425,167 | 6/1995 | Shiga et al. | 29/606 |
| 5,446,311 | 8/1995 | Ewen et al. | 257/531 |
| 5,479,695 | 1/1996 | Grader et al. | 29/602.1 |
| 5,497,337 | 3/1996 | Ponnapalli et al. | 364/489 |
| 5,572,179 | 11/1996 | Ito et al. | 336/200 |

FOREIGN PATENT DOCUMENTS

| | | | |
|---|---|---|---|
| 2-94610 | 4/1990 | Japan | 336/229 |
| 4-167407 | 6/1992 | Japan | 336/229 |

OTHER PUBLICATIONS

Soyuer et al., "Multilevel monolithic inductors in silicon technology", Electronics Letter, vol. 31, No. 5, 1995, pp.359–360.

Oliver et al., "Magnetic and Microwave Resonance Characterization of Ion Beam Sputtered Amorphous $Fe_xNi_{80-x}B_{15}Si_5$ Films", IEEE Transactions on Magnetics, vol. 25, No. 5, 1989, pp. 3355–3357.

Shirakawa et al., "Thin Film Cloth–Structured Inductor for Magnetic Integrated Circuit", IEE Transactons On Magnetics, vol. 26, No. 5, 1990, pp. 2262–2264.

Surganov, "Planarized Thin Film Inductors and Capacitors For Hyrid Integrated Circuits Made of Aluminum and Anodic Alumina", IEEE Transactions On Components, Packaging and Manufacturing Technology–Part B: Advanced Packaging, vol. 17, No. 2, 1994, pp. 197–200.

Ahn et al., "A Fully Integrated Planar Toroidal Inductor with a Micromachined Nickel–Iron Magnetic Bar", IEEE Transactions On Components, Packaging and Manufacturing Technology–Part A, vol. 17, No. 3, 1994, pp. 463–469.

*Primary Examiner*—Michael L. Gellner
*Assistant Examiner*—Anh Mai
*Attorney, Agent, or Firm*—Scully, Scott, Murphy & Presser

[57] ABSTRACT

High quality factor (Q) spiral and toroidal inductor and transformer are disclosed that are compatible with silicon very large scale integration (VLSI) processing, consume a small IC area, and operate at high frequencies. The spiral inductor has a spiral metal coil deposited in a trench formed in at dielectric layer over a substrate. The metal coil is enclosed in ferromagnetic liner and cap layers, and is connected to an underpass contact through a metal filled via in the dielectric layer. The spiral inductor also includes ferromagnetic cores lines surrounded by the metal spiral coil. A spiral transformer is formed by vertically stacking two spiral inductors, or placing them side-by-side over a ferromagnetic bridge formed below the metal coils and cores lines. The toroidal inductor includes a toroidal metal coil with a core having ferromagnetic strips. The toroidal metal coil is segmented into two coils each having a pair of ports to form a toroidal transformer.

4 Claims, 5 Drawing Sheets

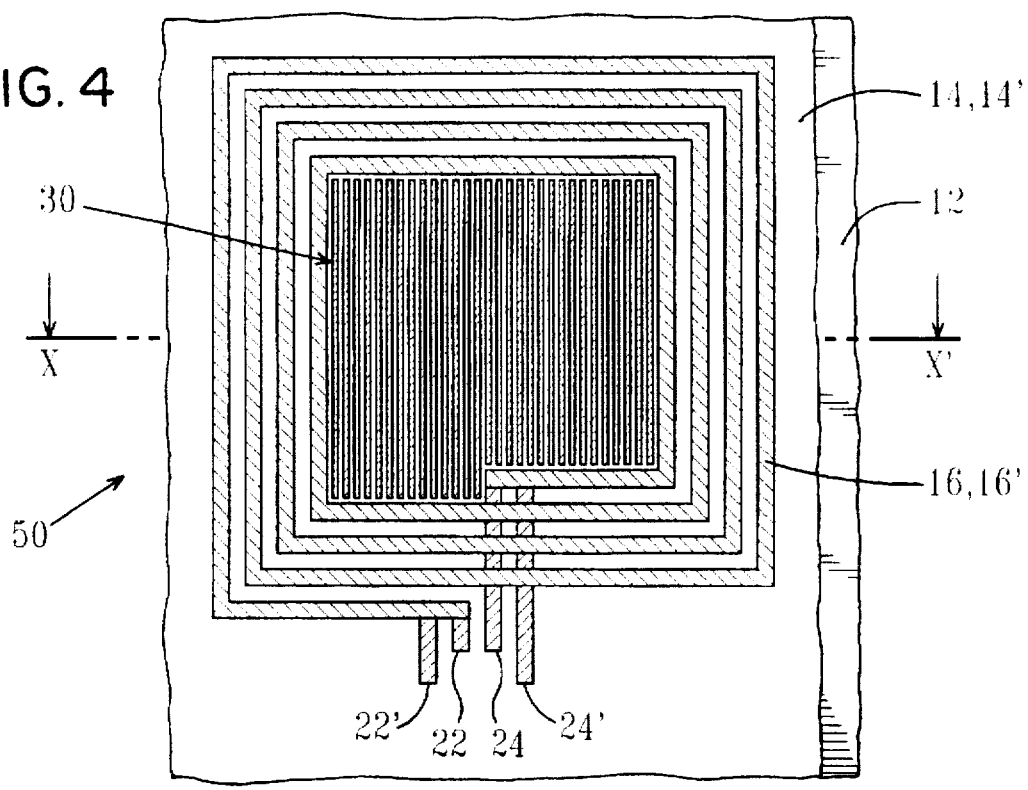
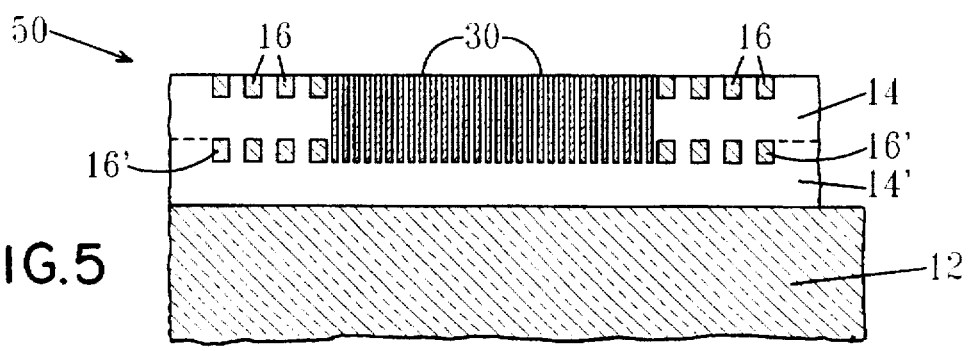
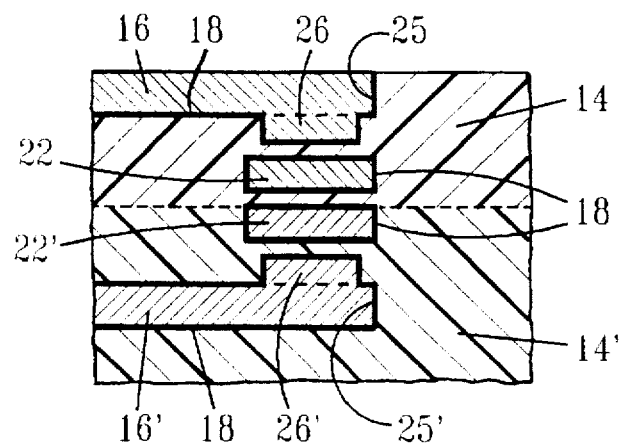

INTEGRATED CIRCUIT TOROIDAL INDUCTOR

BACKGROUND OF THE INVENTION

1. Field of the Invention

The present invention is directed to integrated circuit inductors and transformers, and methods for making thereof, and more particularly, to spiral and toroidal inductors and transformers having high quality factor Q.

2. Discussion of the Prior Art

Many digital and analog components and circuits have been successfully implemented in silicon (Si) based integrated circuits (ICs). Such components include passive devices, such as resistors, capacitors, and inductors.

Implementing high quality factor (Q) inductors that operate at high radio frequencies (RFs) remain problematic in silicon based very large scale integration (VLSI) IC semiconductor chips. For microwave and wireless communications applications, it is desirable to integrate inductors and transformers monolithically on bulk silicon (Si), silicon-on-insulator (SOI), or silicon-on-sapphire (SOS) chips. For these applications, considerable innovation is necessary before adequate values of inductance (L), as well as high quality-factor (Q), are obtained. The quality-factor (Q) is given by equation (1):

$$Q = \omega_0 L/R \qquad (1)$$

where, $\omega_0$=center or resonant angular frequency of oscillation;

L=inductance; and

R=resistance.

Most structures and methods used for fabricating high Q inductors and transformers in hybrid circuits, monolithic microwave integrated circuits (MMICs), or discrete applications (e.g., at larger dimensions, with better metals, on lossless substrates, etc.) are not readily compatible with silicon VLSI processing. The following references discuss conventional high Q inductor fabrication methods:

1. R. Naster et al., "Method for Fabricating Silicon-on-Sapphire Monolithic Microwave Integrated Circuits", U.S. Pat. No. 4,418,470 (1983);
2. R. Stengel and C. Nejdl, "Planar Inductors", U.S. Pat. No. 4,494,100 (1985);
3. R. Scranton and D. Thompson, "Capacitive Sensing Employing Thin Film Inductors", U.S. Pat. No. 4,648,087 (1987);
4. J. Bhagat, "Miniature Inductor for Integrated Circuits and Devices", U.S. Pat. No. 5,070,317 (1991);
5. N. Andoh et al., "Inductive Structures for Semiconductor Integrated Circuits", U.S. Pat. No. 5,095,357 (1992);
6. A. Hubbard, "Integrated Circuit Inductor", U.S. Pat. No. 5,227,659 (1993);
7. I. Saadat and M. Thomas, "Process for Making Microcomponents Integrated Circuits", U.S. Pat. No. 5,279,988 (1994); and
8. C. Ahn et al., "A Fully Integrated Planar Toroidal Inductor with a Micromachined Nickel Iron Magnetic Bar", IEEE Trans. Compon. Packag. Manuf. Technol. A 17,463 (1994).

Conventional inductors and transformers on silicon, which have strictly planar structures and are fabricated with conventional silicon fabrication processes and material, suffer from several limitations. First, conventional aluminum interconnect technology has a relatively high metal resistivity and limited metal thickness, both of which lead to a relatively high resistance of the spiral coil. The high resistivity R lowers the quality factor Q, as seen from equation (1). Second, magnetic fields are strongly coupled to the Si substrate, which is a lossy conductor with large skin depth. Induced currents in the Si substrate act to oppose those in the spiral coil of the inductor and thus reduce the inductance L. Furthermore, energy is dissipated by the high resistivity of the Si substrate, which further decreases the quality-factor Q.

To date, Q values for inductors made by conventional methods are significantly below those achievable on a printed circuit board, or on gallium arsenide (GaAs) substrates with gold (Au) metalization. Another problem is that high inductance values (L), as are required in RF chokes for example, require a large silicon chip area. The large area requirement prevents miniaturization of chips. In addition, physically large RF chokes cannot operate at high frequencies, where the short wavelengths necessitates physically small and miniature components.

To overcome some of the limitations of spiral inductors, toroidal inductors are used. Conventional multilevel interconnect technology allows fabrication of solenoidal or toroidal inductor structures instead of an inductor having a spiral configuration. Toroidal inductors have the benefit of confining the magnetic flux, thereby minimizing substrate losses. However, conventional integrated toroidal inductors have comparably small inductance and Q values for a given silicon area, relative to the planar spiral inductor configuration. This is because the area enclosed by wire windings of conventional toroidal inductors is small due to the limit in vertical dimensions of the thin films used in conventional VLSI processing.

In light of the foregoing, there is a need for high Q inductors and transformers suitable for integration in IC chips, such as VLSI IC chips.

SUMMARY OF THE INVENTION

The object of the present invention is to provide high Q inductors and transformers, and methods of making thereof, that eliminate the problems of conventional inductors and transformers.

Another object of the present invention is to provide high Q inductors and transformers that are suitable for integration in VLSI IC chips, consume a small IC area, and operate at high frequencies.

These and other objects of the inventions are achieved by a spiral inductor and a method of making thereof. The spiral inductor comprises a substrate; a dielectric layer having a spiral trench; and a first spiral metal coil formed in the spiral trench over the liner to increase an aspect ratio thereof.

A ferromagnetic liner lines the bottom and sides of the trench, and a cap layer may cap the first metal coil so that the first spiral metal coil is enclosed by the cap and liner layers. In addition, an underpass contact is formed in the dielectric layer below one end of the first metal coil. This one end of the first metal coil extends into a via formed in the dielectric layer to connect to the underpass contact.

Ferromagnetic core lines are formed in a core surrounded by the first metal coil. These core lines are electrically separated from each other.

In another embodiment of the present inventions, a second metal coil is formed in the dielectric layer. The second metal coil may be vertically stacked over the first metal coil or adjacent thereto. In the latter case, a ferromagnetic bridge is formed below, and contacts, the two adjacent metal coils. The ferromagnetic bridge may also be formed below the first metal coil in the vertically stacked coils configuration. The ferromagnetic bridge reduces magnetic flux penetration into the substrate. This increases the quality factor Q by increasing the inductance L.

In the vertically stacked configuration, an overpass contact may be formed in the dielectric layer above the second metal coil. The two vertically stacked or adjacent coils may each have a pair of ports to form a spiral transformer.

Another embodiment of the present inventions is a toroidal inductor and a method of making thereof. The toroidal inductor comprises a dielectric layer formed over a substrate, and a toroidal metal coil formed in the dielectric layer.

The toroidal metal coil is formed by segmenting the first metal coil of the spiral inductor into first metal segments that are electrically separated from each other by the dielectric layer. Second metal segments are formed over the first metal segments, where the second metal segments are electrically separated from each other and from the first metal segments by the dielectric layer. Metal studs are formed in the dielectric layer to connect opposing ends of the two metal segments to form the toroidal metal coil in the dielectric layer.

Inner and outer surfaces of the toroidal metal coil are lined with a ferromagnetic material. Ferromagnetic material or strips are formed in a core defined by the inner surface of the toroidal metal coil. The ferromagnetic strips are separated from each other and from the inner surface by the dielectric layer.

The spiral and toroidal inductors are formed using a series of damascene processes, as described in greater detail in U.S. Pat. Nos. 4,702,792 and 4,789,648, both to Chow et al., and U.S. Pat. No. 4,944,836 to Beyer et al., all assigned to IBM corporation and incorporated herein by reference. These damascene processes include etching trenches in the dielectric, filling the trenches with desired material, e.g., metal or ferromagnetic, and planarizing to remove excess material remaining after the filling step.

The integrated spiral transformer on a silicon substrate, which is formed by coordinating two spiral coils or inductors in a vertically stacked or side-by-side structure, has undesirable capacitive coupling. That is, coupling between two ports of the spiral transformer, made from two spiral inductors, is not only of an electromagnetic type, as desired. In addition to the electromagnetic component of the coupling between the two spiral transformer ports, there is also a strong capacitive component as a result of the geometrical arrangement.

To reduce the capacitive coupling, another embodiment of the present invention, is an integrated toroidal transformer on a silicon substrate. A toroidal transformer is formed by splitting or segmenting the toroidal coil of the toroidal inductor into two separate windings or coils, each having a pair of ports. This forms the toroidal transformer that has a much less undesirable capacitive cross-coupling than the spiral transformer.

The inventive inductor structure includes single-and multilevel integrated inductor structures made by a metal (single) damascene and dual-damascene processes, for example, with copper as the metal. Optional ferromagnetic thin-film materials may be used. The inventive inductor is easily incorporated on VLSI integrated circuit (IC) chips.

Advantages of the inventive inductor include the following. First, use of the damascene and dual-damascene processes, with a preferred (high-conductivity) metal such as copper (gold or silver), allow thicker dimensions for single and multilevel interconnects. The thick interconnects further lower the interconnect resistance. The thick interconnects, and the low resistance material (e.g., copper), greatly reduce inductor parasitic resistance R, thereby increasing Q.

Second, a ferromagnetic liner near sidewalls, bottoms, and/or tops of a metal line or coil of the inductor, e.g., the spiral inductor, as can readily be incorporated by the damascene process, increases the permeability in the region enclosed by the inductor where the magnetic field is the largest. This increases the inductance L, which in turn increases Q.

Third, a further increase of L is achieved by adding laminated dummy structures of ferromagnetic and copper material in a central or core region of the inductor structure. The ferromagnetic core is also beneficial in a transformer structure, comprising two or more vertically stacked or side-by-side spiral coils, because the ferromagnetic core increases the mutual inductance between the coils without increasing the parasitic capacitance.

Fourth, a ferromagnetic core can also be introduced into the toroidal inductor structure so that the inductance is increased significantly over that achievable with an air core. A toroidal transformer with a ferromagnetic core has the advantage that the coils could be spaced apart laterally, in order to reduce the parasitic capacitance between them, without sacrificing mutual inductive coupling.

BRIEF DESCRIPTION OF THE DRAWINGS

Further features and advantages of the invention will become more readily apparent from a consideration of the following detailed description set forth with reference to the accompanying drawings, which specify and show preferred embodiments of the invention, wherein like elements are designated by identical references throughout the drawings; and in which:

FIGS. 4–6 show top and cross-sectional views of a damascene spiral transformer having vertically stacked spiral coils according to the present invention;

DETAILED DESCRIPTION OF THE INVENTION

Figures 1, 2, 3:
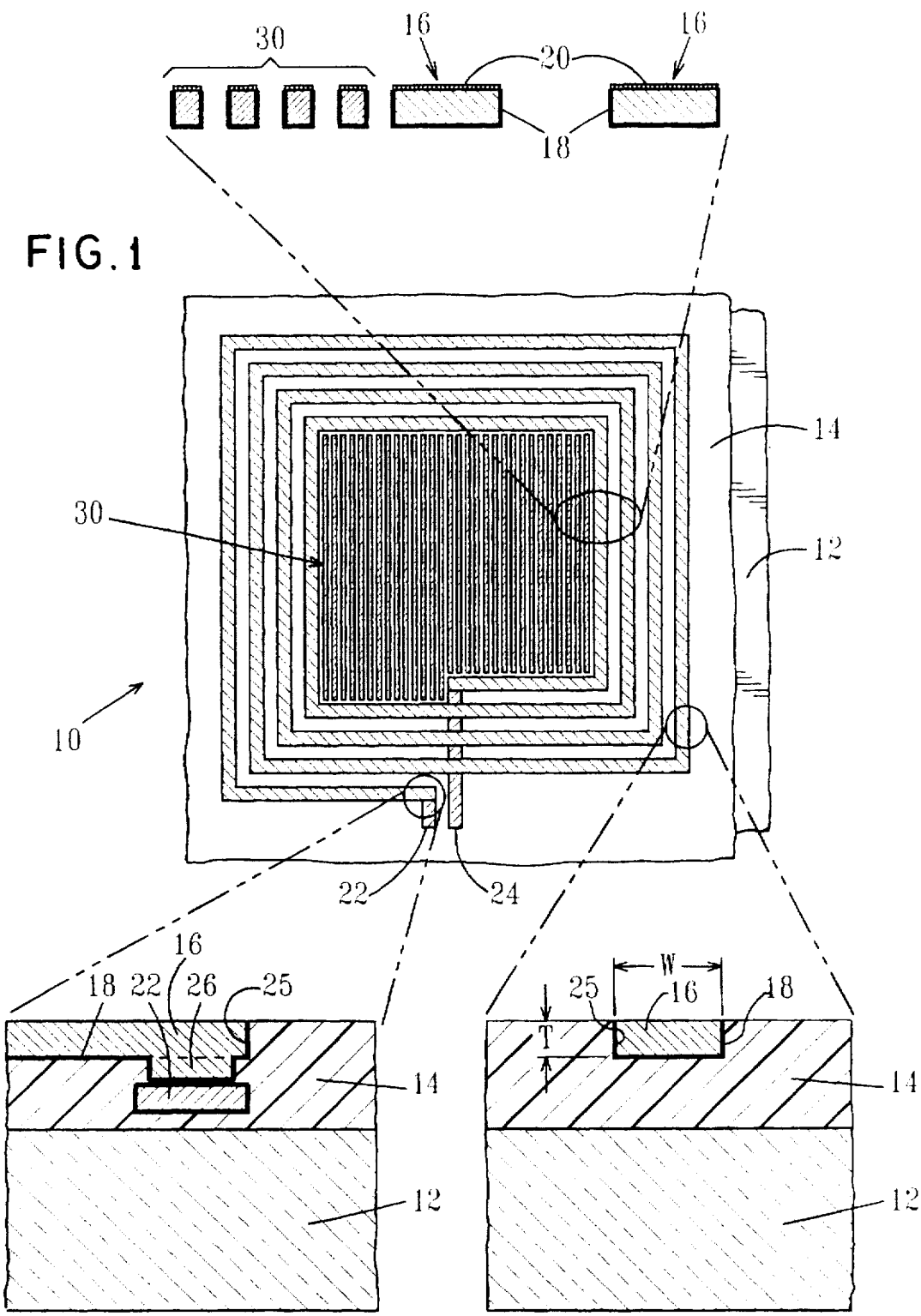
FIGS. 1–3 show top and cross-sectional views of a damascene spiral inductor according to the present invention.

FIGS. 1–3 show top and cross-sectional views of a damascene copper/ferromagnetic spiral VLSI inductor 10, according to one embodiment of the present invention. The spiral inductor 10 is fabricated over a substrate 12, which may be silicon (Si), silicon-on-insulator (SOI), or silicon-on-sapphire (SOS), for example. A dielectric layer or film 14 is formed over the substrate 12. The substrate 12 is separated from a metal line or coil 16 by the dielectric film 14. Illustratively, the metal 16 is copper (Cu), aluminum (Al), tin (Ti), gold (Au), silver (Ag), or a combined alloy thereof. Preferably, the metal 16 is copper. The metal line 16 is arranged in a spiral shape. FIG. 1 shows the metal line 16 in a square spiral shape, however, other spiral shapes, such as rectangular or circular spirals may also be formed.

The metal line 16 is formed by using a dual damascene process, which includes the following steps:

(a) etching a spiral trench 25 and via 26 into the dielectric film 14;

(b) depositing metal 16 in the etched spiral trench 25; and (c) planarizing, e.g., chemical-mechanical polishing (CMP), the deposited metal 16 to remove excess metal from the wafer surface.

The metal depositing step comprises electrolytic or electroless plating of a high conductivity metal, such as copper, gold, and silver, for example. Alternatively, the metal depositing step comprises chemical vapor deposition of a high conductivity metal, such as aluminum for example.

A single damascene process refers to forming and filling trenches, while a dual damascene process refers to simultaneously forming trenches and vias, and filling thereof with a desired material.

The trench 25 fabricated by the dual damascene process, and consequently the metal line 16 filling the trench 25, have a large aspect ratio. The aspect ratio of the metal line 16 is the ratio of thickness to width T/W of the metal line 16 where T is thickness and W is width. The metal line 16 formed by this damascene process is thick, thus having an increased aspect ratio. This reduces the resistance of the metal line or coil 16, which increases the quality factor Q. Illustratively, the thickness T of the metal line 16 is approximately 3 microns, and the width W is approximately 3 microns or more.

The Cu-dual-damascene process enables substantial series-resistance reduction compared to Al(Cu)/Ti wiring (e.g. 3X reduction). This is due to an approximately 40% resistance reduction of copper and the larger aspect ratios achieved with the damascene process.

Further, this damascene process allows addition of a liner film 18 prior to metal 16 deposition step (b). The liner film 18 lines the bottom and sidewalls of the trench, and separates the metal line 16 from the dielectric layer 14. The inductance (L) per line length of the spiral inductor 10 is increased by using a ferromagnetic material, such as Permalloy, AlNiCo, etc., for the liner film 18.

Next, a cap layer 20 (FIG. 1), which may be of the same ferromagnetic material as the liner 18, is formed over the top of the metal line 16. This encloses the metal line 16 by the ferromagnetic material of the liner 18 and cap 20. Illustratively, the cap layer 20 is formed by electroless plating. The ferromagnetic liner and cap 18, 20 increase the self-inductance of the wire 16, thus increasing the total inductance L.

The dual-damascene process is also used for the formation of underpass contacts 22, 24 at the ends of the spiral metal line 16. The underpass contacts 22, 24 are located below the metal line 16, and are connected to the ends of the spiral metal line 16 through metal filled vias, one of which is shown in FIG. 2 as reference number 26. Illustratively, the underpass contacts 22, 24 are perpendicular to the metal line 16.

Forming the underpass contacts 22, 24 and vias 26 by this dual-damascene process has the advantage that the same metal deposition and CMP steps simultaneously form both the via 26 and the metal line 16. A single damascene process may also be used instead of the dual-damascene process, to form the spiral metal coil 16 over a preformed via 26 and underpass contacts 22, 24.

The copper damascene process in particular enables formation of much higher aspect-ratio lines and much larger-area vias than conventional Al-line/W-stud processes. The large aspect ratio of the metal line 18 substantially reduces the series-resistance of the spiral inductor 10. Similarly, the larger-area vias 22, which are filled with a metal having a low resistance, substantially reduce the contact and via resistances in the multiple-level spiral inductor 10.

A core comprising narrow dummy-lines 30 may be added to the center region of the spiral inductor surrounded by the metal line 16, without using any additional process steps. For example, during the dielectric 14 etching step, trenches are formed therein for both the metal line 16 and the ferromagnetic core lines 30.

The step of depositing the ferromagnetic liner in the spiral trench to be filled with the metal coil 16 also fills the core trenches to form the ferromagnetic core lines 30.

Illustratively, these core trenches are narrow and parallel to each other. The core trenches are narrow so that they become nearly completely filled during the ferromagnetic liner film deposition step. This maximizes the permeability of the core trenches. Thus volume-fraction, or the percent volume of the ferromagnetic material relative to the available volume, is high in the core lines 30, and low in the much wider spiral metal line windings 18, contact via 26, and underpass 22. This minimizes the series resistance of the inductor windings. The core lines 30 are also separated electrically by the dielectric layer 14, e.g., laminated, so that Eddy currents cannot flow in the core lines 30.

As shown in FIGS. 4–6, in another embodiment of the present invention, two spiral coils or metal lines 16, 16' are vertically stacked over each other to form a spiral transformer 50. The spiral transformer 50 has a pair of ports or contacts 22, 24, and 22', 24', associated with the spiral metal lines 16, 16', respectively. FIG. 5 is the cross-sectional view of FIG. 4 along lines XX'. FIG. 6 is the cross-sectional view of contact regions of FIG. 4 and is comparable to FIG. 2.

Many features of the spiral transformer 50 are similar to that of the spiral inductor 10. That is, each of the two spiral coils 16, 16' is formed by using similar steps which form similar elements 16–26 shown in FIGS. 1–3. As shown in FIG. 6, the only difference is that element 22' refers to an overpass contact 24', instead of the underpass contact 22, and via 26' is located below the overpass contact 22' of the lower metal lines 16', as compared to the via 26, which is located above the underpass contact 22.

In an illustrative embodiment, after forming a first metal coil 16' in a first spiral trench 25' etched in a first dielectric layer 14', a second metal coil 16 is formed in a second spiral trench 25 etched in a second dielectric layer 14. The second metal coil 16 is vertically stacked over and electrically separated, by the dielectric layer 14, from the first metal coil 16'.

As in the spiral inductor 10 of FIGS. 1–3, ferromagnetic core lines 30, which are parallel to each other for example, are formed in the dielectric layer 14 in a core surrounded by the vertically stacked spiral coils 16, 16'. The ferromagnetic core lines 30 improve electromagnetic coupling between the vertically stacked spiral coils 16, 16' in the spiral transformer structure 50, which is integrated on the substrate 12. The ferromagnetic core lines 30 of the spiral transformer 50 extend from the top surface of the transformer 50 to reach a depth in the dielectric layer 14, which depth is similar to the depth of the lower elements 16' to 26'.

Figures 7, 8:
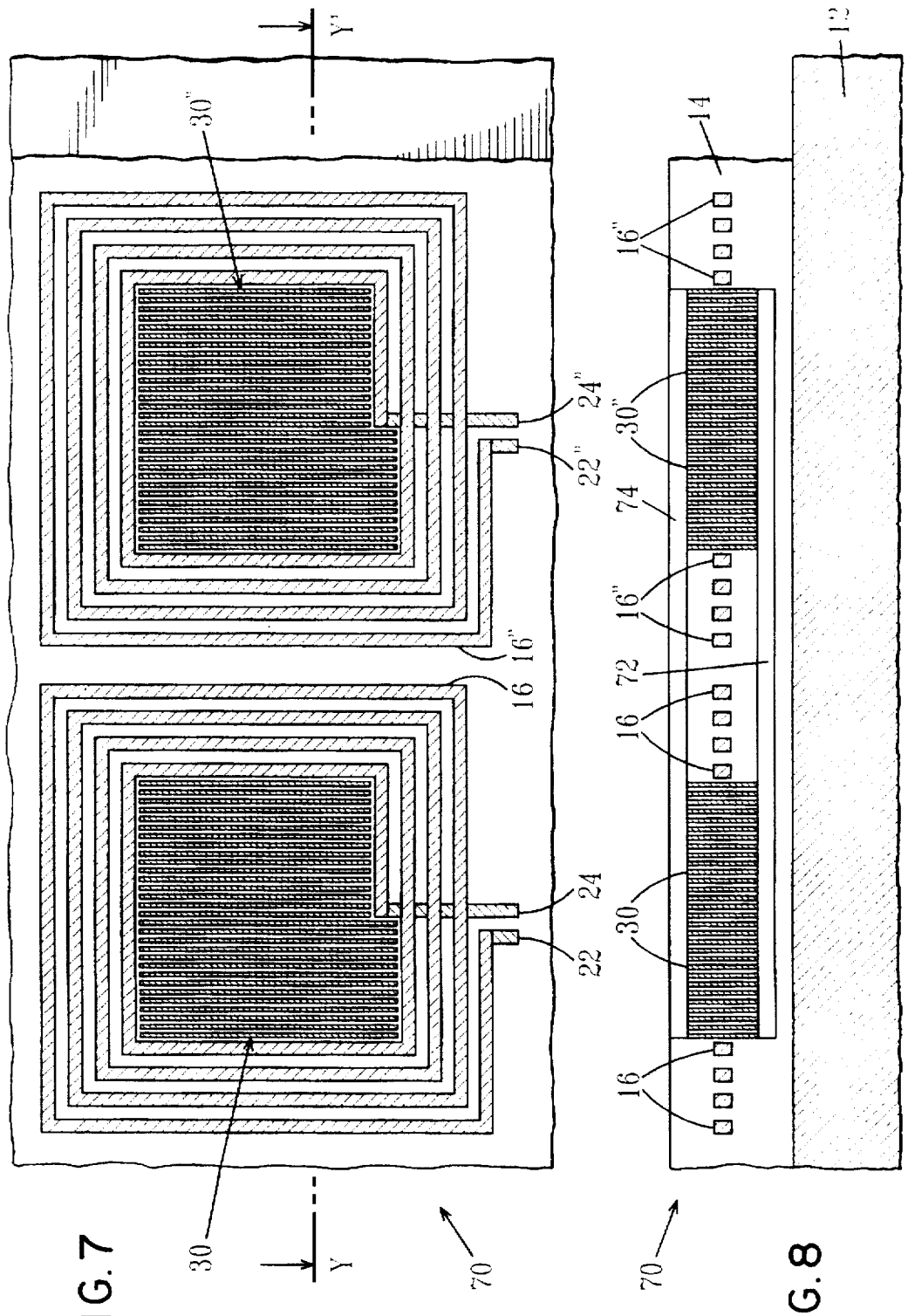
FIGS. 7–8 show top and cross-sectional views of a damascene spiral transformer having side-by-side spiral coils according to the present invention.

FIGS. 7–8 show an alternative embodiment of a spiral transformer 70, comprising two spiral inductors 10 of FIGS. 1–3 formed side-by-side, e.g., either concurrently or sequentially, over the substrate 12. FIG. 7 is a top view of the spiral transformer 70, while FIG. 8 is a cross-sectional view of FIG. 7 along line YY'. The side-by-side spiral coils 16, 16" of the transformer 70 surround ferromagnetic cores 30, 30", respectively. In this case, both spiral coils 16, 16" are preferably contacted through underpass contacts, which are similar to the underpass contact 22 shown in FIG. 2. A ferromagnetic bridge 72 is formed during the fabrication process of those underpass contacts. The ferromagnetic bridge 72 is formed below and between adjacent portions of the two spiral coils 16, 16", and below the two ferromagnetic core lines 30, 30". The ferromagnetic bridge 72 increases the mutual inductance between the two spiral coils 16, 16".

A second ferromagnetic bridge 74 may be provided to further increase the mutual inductance between the two spiral coils 16, 16". The second ferromagnetic bridge 74 may be formed over the two spiral coils 16, 16" and ferromagnetic core lines 30, 30", for example, aligned with the lower ferromagnetic bridge 72. By confining large portions of the magnetic fields external to the two spiral coils 16, 16", these ferromagnetic bridges 72, 74 decouple the transformer from the integrated circuit substrate. Such a ferromagnetic bridge structure can also be applied to the stacked transformer structure 50 of FIGS. 4 and 5 and to the spiral inductor 10 of FIGS. 1–3 in order to reduce or restrain the magnetic flux from entering the lossy silicon substrate.

Figure 9:
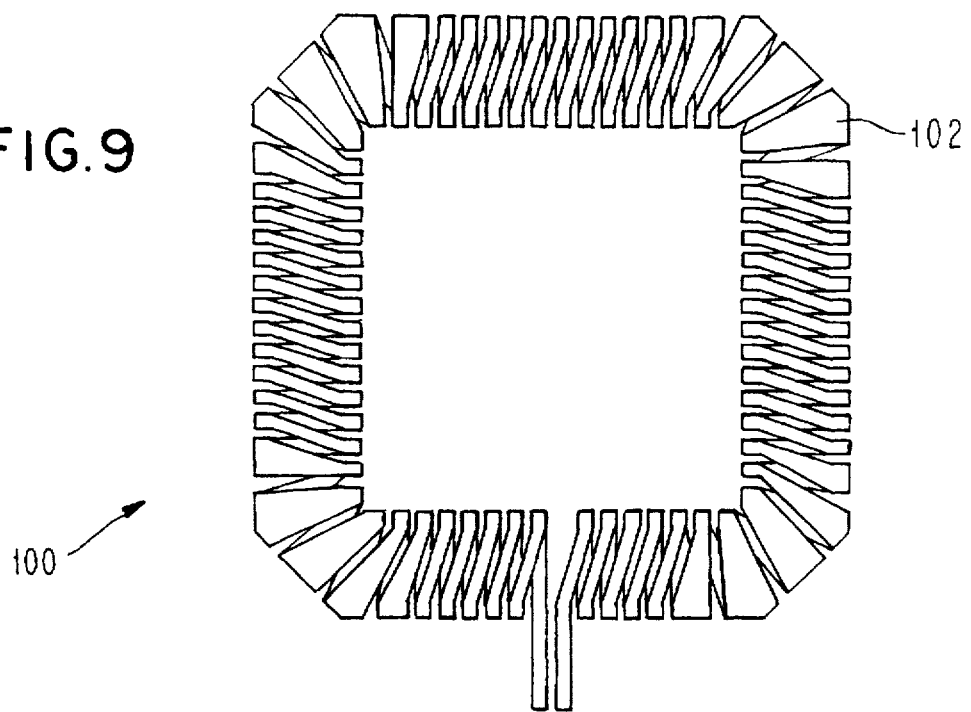
FIGS. 9–11 show top, partial three-dimensional, and cross-sectional views of a damascene toroidal inductor with an air core according to the present invention.
Figure 10:
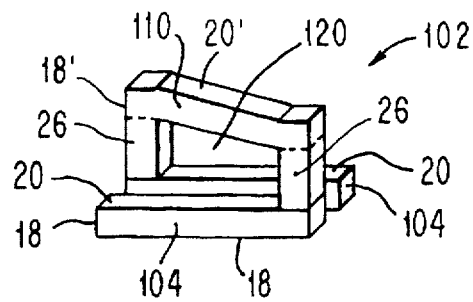

In another embodiment of the present invention, toroidal inductor and transformer structures are formed by using a similar fabrication process as described in connection with the spiral inductor 10 and transformers 50, 70 of FIGS. 1–8. FIG. 9 shows a top view of a damascene toroidal inductor 100 having continuous loops 102 that are arranged to form a square shaped toroidal inductor 100. The loops 102 may also be arranged to form other shaped toroidal inductors, such as rectangular or circular toroidal inductors. FIG. 10 shows a three-dimensional perspective view of one of the loops 102, and FIG. 11 shows a cross-sectional view of a partial loop 102.

Figure 11:
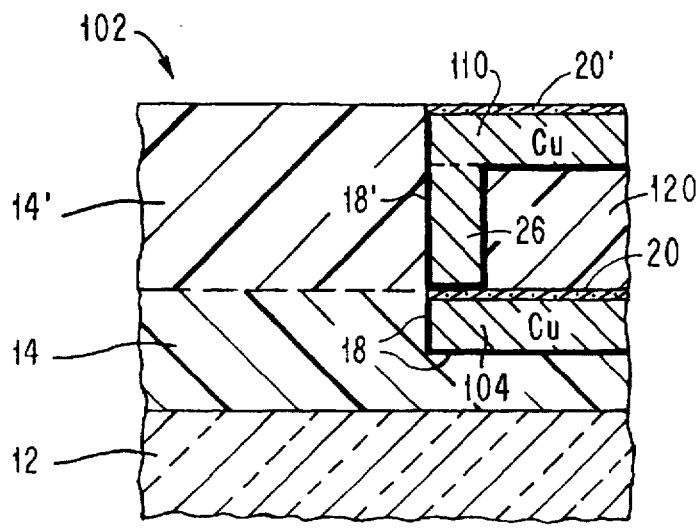

As shown in FIGS. 10 and 11, the loop 102 has first or lower metal, e.g., copper (Cu), sections 104 that are separated from each other. The lower Cu sections 104 are formed using a process similar to that described in connection with FIG. 3. That is, a planar spiral trench is formed, e.g., etched, in the dielectric layer 14, and metal deposited therein. Next, the planar spiral metal is segmented, e.g., portions thereof etched, to form the separated metal segments or sections 104.

Preferably, instead of forming a single planar spiral trench, separated trenches are formed on the dielectric layer 14 located above the substrate 12, and are arranged adjacent to each other to form a planar loop having a square, rectangular, circular or other shapes. The trenches are filled with copper 104. Excess copper is removed by planarizing, e.g., using CMP.

Similar to FIG. 3, a ferromagnetic liner 18 may be formed at bottom and sides of the trenches prior to deposition of the metal. The ferromagnetic liner 18 enhances the inductance of the metal sections 104. A ferromagnetic cap 20 may also be formed over the metal sections 104. This encloses the metal sections 104 with the ferromagnetic liner 18 and caps 20.

Next another dielectric layer 14' is deposited over the capped metal sections 104 and exposed portions of the first or lower dielectric layer 14. A dual-damascene Cu-process is used to form vias 26 and a set of top trenches by selectively etching the top dielectric layer 14'. Each vias 26 extends to one end of the lower metal sections 104. A separate via 26 is formed over each end of each lower metal section 104.

The dual damascene process also includes filling the vias 26 and top trenches with metal. The deposited copper in the top trenches forms the top Cu sections 110. Filling the vias 26 and top trenches with metal forms the toroidal coil loops 102 having lower and upper metal sections 104, 110, and vias 26. Each toroidal coil loop 102 has its top Cu section 110 connected to an opposite end of an adjacent lower Cu sections 104. Inner surfaces of the toroidal coil loops 102 define a core 120.

Prior to this deposition of metal, the vias 26 and top trenches may be lined with a ferromagnetic liner 18'. A ferromagnetic cap 20' may also be formed over the top Cu sections. This encloses the top Cu sections 110 in ferromagnetic material.

Figure 13:
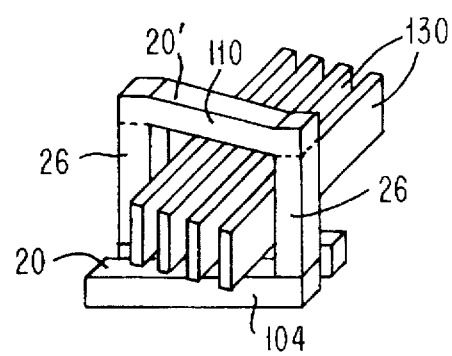
Figure 14:
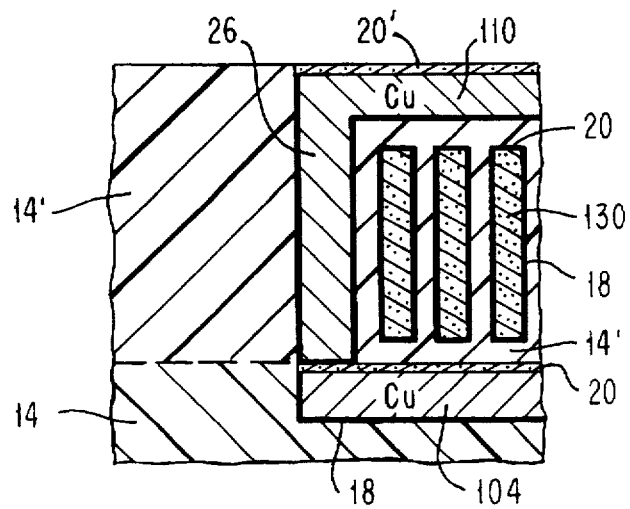

Instead of having a dielectric core 120 between two Cu sections 104, 110 and vias 26, ferromagnetic strips may be formed in the core 120. FIG. 13 shows ferromagnetic strips 130 formed within the dielectric layer of the core 120. The ferromagnetic strips 130 are preferably formed using a damascene process and do not electrically contact the metal sections 104, 110. Instead of the ferromagnetic strips 130, a ferromagnetic layer electrically insulated from the metal section 104, 110 may be formed, by the damascene process. However, segmenting the ferromagnetic layer into the ferromagnetic strip 130 prevents excessive Eddy currents.

The damascene process forming the ferromagnetic layer or ferromagnetic strips is similar to previously described damascene processes. That is, the top dielectric layer 14' is formed over the lower as sections 104, trenches etched therein and lined with ferromagnetic liner 18. Next, ferromagnetic material is deposited to fill the lined trenches. Excess ferromagnetic material may be removed by planarizing, e.g., using CMP, and the ferromagnetic filled trenches capped with a ferromagnetic cap 20. The ferromagnetic liner 18, cap 5 and ferromagnetic material filling the trenches may be identical. That is the ferromagnetic strips 130 may be formed by filling the core trenches.

Alternatively, the ferromagnetic strips 130 may be formed as follows. After forming a thin dielectric layer over the lower Cu section 104, the ferromagnetic layer is formed in the core 120. Selectively etching the ferromagnetic layer forms the ferromagnetic strips 130 which are separated from each other.

After forming the ferromagnetic strips 130, the top dielectric layer 14' is formed thereon, (if not already present, e.g., in the case having a ferromagnetic layer instead of ferromagnetic strip 13), and using the dual-damascene Cu-process described in connection with FIGS. 10, 11, the metal filled vias 26 and top Cu sections 110 are formed to close the toroidal coil loops 102.

The toroidal inductor 100 has a larger inductance than the spiral inductor 10 of FIG. 1. The achieved inductance enhancement of the toroidal inductor 100 is roughly equal to the relative permeability of the ferromagnetic material multiplied by the volume-fraction it occupies in the core area. This inductance enhancement is in the range of approximately 500–10000. The magnetic flux is confined within the closed ferromagnetic core-loop 120 and does not stray into the silicon substrate 12, as in the case of the spiral inductor structure 10 of FIG. 1. This allows for high Q-factors at high inductance values and reduces the possibility for coupling between adjacent inductors.

Figure 12:
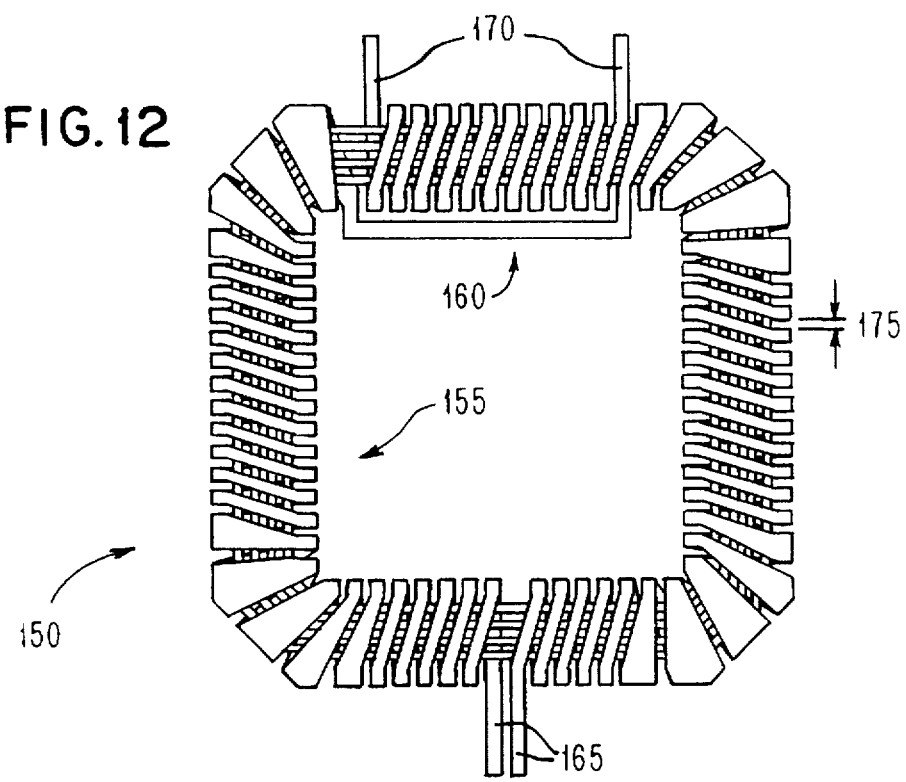
FIGS. 12–14 show top, partial three-dimensional, and cross-sectional views of a damascene toroidal transformer with a ferromagnetic core according to the present invention.

The toroidal inductor 100 having a ferromagnetic core has also advantages if designed as a transformer. FIG. 12 shows a toroidal transformed 150 where the metal loops 102 of FIG. 9 are separated into two loops 155, 160, having ports 165, 170, respectively. The ferromagnetic core or strips 130 support a strong mutual inductive coupling between the ports 165, 170, while the lateral spacing 175 between adjacent loops can be sufficiently large to minimize the parasitic capacitance.

The spiral and toroidal inductors and transformers may be integrated on semiconductor integrated chips (ICs), such as VLSI chips, that include various other circuits and components, which may be active and passive devices. Illustratively, the spiral and toroidal inductors and transformers are integrated monolithically on bulk silicon (Si), silicon-on-insulator (SOI), or silicon-on-sapphire (SOS) chips. For example, such chips may operate at high radio frequencies, and used in microwave and wireless communications applications.

The inventive spiral and toroidal inductors and transformers require small silicon chip area and have thick metal coils and interconnects, i.e., metals with large aspect ratio. Thus, the metal coils and interconnects have low resistance which increases the quality factor Q. The magnetic fields are confined in the ferromagnetic strips, thus reducing coupling of the magnetic fields to the Si substrate. This increases the inductance L and, consequently, the quality factor Q. In addition, the confined magnetic fields reduce energy dissipation in the Si substrate, which prevents reduction in the quality factor Q.

The laminar ferromagnetic core lines 30 (FIG. 1) of the spiral inductor/transformer and strips 130 (FIG. 13) of the toroidal inductor/transformer further increase the inductance L, by raising the magnitude of the magnetic field in the core. In the spiral case, only a small portion of the extensive magnetic field is coupled by the ferromagnetic lines 30, increasing the inductance L by a factor of approximately 2. In the toroidal case, the ferromagnetic strip 130 increase L by up to approximately a factor of 10,000.

In a specific example, spiral inductors with Q of 40 at 5.8 GHz for a 1.4 or H inductor, and Q of 13 at 600 MHZ for an 80 nH inductor has been achieved. These inductors have approximately 2x to 3x higher Q-factors than that of conventional silicon integrated inductors.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by letters patent is:

1. An integrated circuit toroidal inductor comprising:

a dielectric layer formed over a substrate, and a toroidal metal coil formed in said dielectric layer, said toroidal metal coil having upper and lower metal segments, each upper metal segment having a planar metal portion and a metal stud portion extending downward from said planar metal portion towards said lower segment, said metal stud portion connecting opposing ends of said lower metal segments and said planar metal portions, said integated circuit toroidal inductor further having ferromagnetic strips formed in a core defined by an inner surface of said toroidal metal coil, said ferromagnetic strips being separated from each other and from said inner surface by said dielectric layer.

2. The integrated circuit toroidal inductor of claim 1, wherein inner and outer surfaces of said toroidal metal coil are lined with a ferromagnetic material.

3. The integrated circuit toroidal inductor of claim 1, further comprising a ferromagnetic material formed in a core defined by an inner surface of said toroidal metal coil.

4. The integrated circuit toroidal inductor of claim 1, wherein said toroidal metal coil is segmented into two toroidal coils each having a pair of ports to form a toroidal transformer.

* * * * *